(12) United States Patent
Nakatani et al.

(10) Patent No.: US 6,525,921 B1
(45) Date of Patent: Feb. 25, 2003

(54) CAPACITOR-MOUNTED METAL FOIL AND A METHOD FOR PRODUCING THE SAME, AND A CIRCUIT BOARD AND A METHOD FOR PRODUCING THE SAME

(75) Inventors: Seiichi Nakatani, Osaka (JP); Koichi Hirano, Osaka (JP); Mikinari Shimada, Kyoto (JP); Yasuhiro Sugaya, Osaka (JP)

(73) Assignee: Matsushita Electric Industrial Co., LTD, Osaka (JP)

( * ) Notice: Subject to any disclaimer, the term of this patent is extended or adjusted under 35 U.S.C. 154(b) by 164 days.

(21) Appl. No.: 09/711,015

(22) Filed: Nov. 9, 2000

(30) Foreign Application Priority Data

Nov. 12, 1999 (JP) .............................. 11-322567

(51) Int. Cl.⁷ .............................................. H01G 4/228
(52) U.S. Cl. ..................... 361/306.3; 174/264; 361/313; 361/328; 361/301.4
(58) Field of Search ................. 174/264, 262, 174/266; 361/313, 328, 301.4, 306.3, 734, 761, 763

(56) References Cited

U.S. PATENT DOCUMENTS

| | | | |
|---|---|---|---|
| 4,016,463 A | * 4/1977 | Beall et al. ................ | 361/709 |
| 4,759,965 A | 7/1988 | Kato et al. | |
| 5,375,035 A | * 12/1994 | Stoddard ..................... | 174/260 |
| 5,568,352 A | * 10/1996 | Hwang ................... | 257/29.343 |
| 5,793,600 A | * 8/1998 | Fukuda et al. ............. | 29/25.42 |
| 6,002,575 A | * 12/1999 | Kotecki et al. ............. | 257/303 |
| 6,060,150 A | 5/2000 | Nakatani et al. | |
| 6,292,352 B1 | * 9/2001 | Yamamichi ................. | 257/295 |
| 6,300,686 B1 | * 10/2001 | Hirano et al. ............... | 257/781 |

FOREIGN PATENT DOCUMENTS

| | | |
|---|---|---|
| EP | 0 568 930 A2 | 11/1993 |
| EP | 0 907 205 A2 | 4/1999 |
| JP | 62-131411 | 6/1987 |
| JP | 1-152688 A | 6/1989 |
| JP | 2-305490 A | 12/1990 |
| JP | 3-069191 A | 3/1991 |
| JP | 6-268345 | 9/1994 |
| JP | 10-173097 | 6/1998 |
| JP | 11-168112 | 6/1999 |

* cited by examiner

Primary Examiner—David L. Talbott
Assistant Examiner—José H. Alcala
(74) Attorney, Agent, or Firm—Merchant & Gould P.C.

(57) ABSTRACT

A capacitor-mounted metal foil of the present invention is provided with a metal foil and a plurality of capacitors formed on the metal foil. Each of the capacitors includes a conductive layer disposed above the metal foil, and a dielectric layer disposed between the metal foil and the conductive layer.

16 Claims, 10 Drawing Sheets

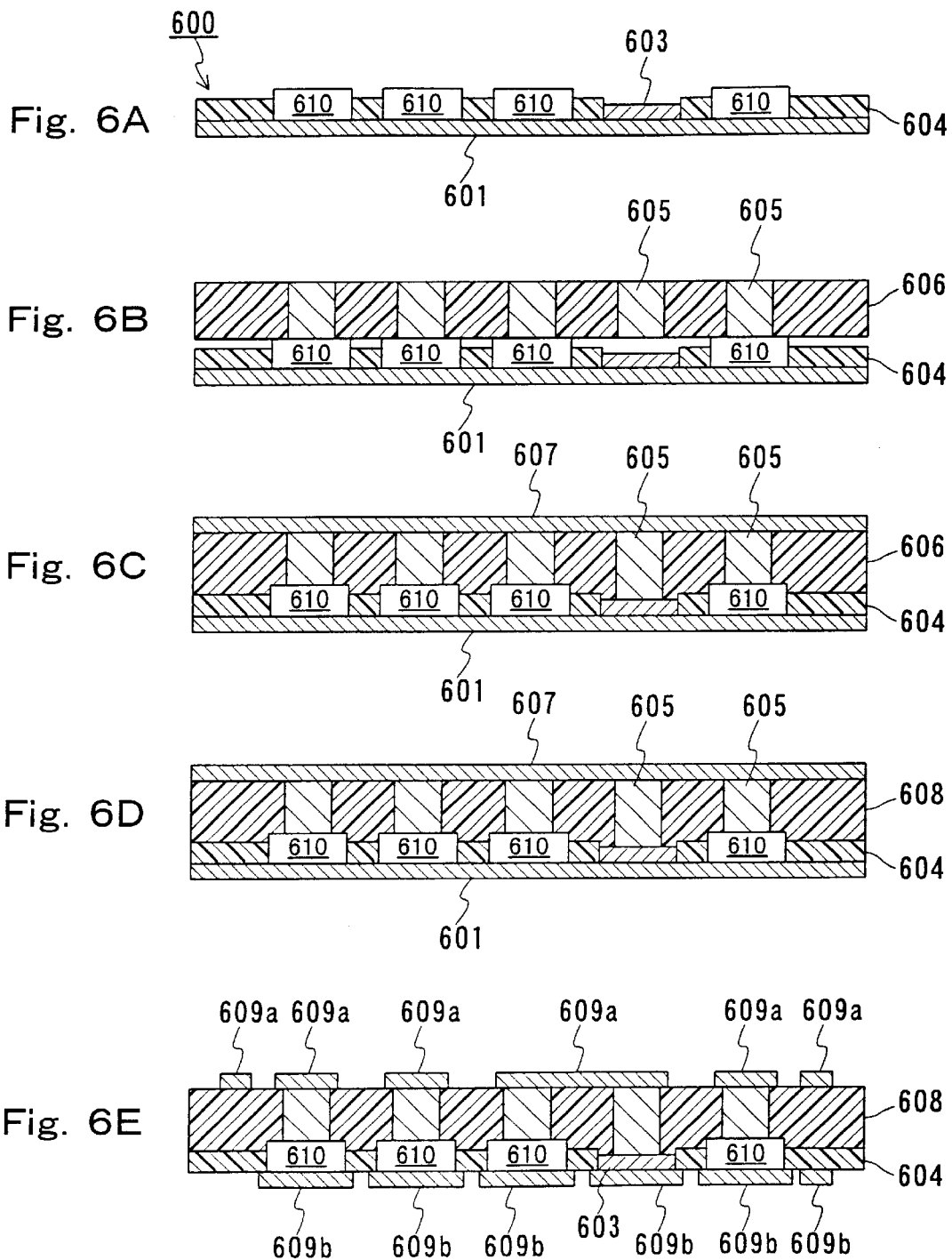

CAPACITOR-MOUNTED METAL FOIL AND
A METHOD FOR PRODUCING THE SAME,
AND A CIRCUIT BOARD AND A METHOD
FOR PRODUCING THE SAME

BACKGROUND OF THE INVENTION

1. Field of the Invention

The present invention relates to a capacitor-mounted metal foil and a circuit board using the same, and a method for producing them.

2. Description of the Related Art

In recent years, with the demand for high performance and miniaturization of electronic equipment, there is an increasing demand for high density and high function of a semiconductor device. This results in a demand for a miniaturized high-density circuit board for mounting a semiconductor device.

Furthermore, when semiconductor devices are mounted at high density, heat and noise are generated by components. Thus, in order to mount semiconductor devices at high density, a circuit board is required that allows high-density mounting and is excellent in a thermal dissipation property and noise resistance.

As a technique of improving the thermal dissipation property of a circuit board, a heat-conductive substrate using a thermosetting resin and an inorganic filler has been proposed (see JP 10-173097 A). Furthermore, JP 11-168112 A has proposed a method for heating and pressurizing a sheet-shaped material containing a mixture of an inorganic filler and a thermosetting resin, thereby performing mounting and sealing of semiconductor devices simultaneously.

As a general method for enhancing the noise resistance of a circuit board, capacitors for removing noise are mounted on a circuit board so as to absorb high-frequency noise and ripple. However, in the case where capacitors are mounted on a circuit board, the size of the circuit board is enlarged so as to ensure a mounting area for the capacitors. Therefore, there has been an attempt in which capacitors are embedded in a circuit board.

For example, methods for forming a capacitor in a ceramic substrate have been proposed (JP 62-131411 A, JP 1-152688 A, and JP 2-305490 A). According to these methods, a ceramic substrate material and a ceramic dielectric material capable of being sintered under the same conditions as those of the substrate material are layered on one another, and both the materials are sintered simultaneously, whereby capacitors are formed in a ceramic substrate.

However, a conventional ceramic substrate with capacitors embedded therein entails a high cost. Furthermore, it takes a long period of time to produce a prototype of and to change the design of such a substrate. On the other hand, according to the method for embedding ceramic capacitors made of a sintered body in an inexpensive resin substrate, the sintered body may be broken when the substrate is layered to form a multi-layer structure.

SUMMARY OF THE INVENTION

Therefore, with the foregoing in mind, it is an object of the present invention to provide a capacitor-mounted metal foil, which allows high-density mounting and allows an inexpensive circuit board excellent in noise resistance and a thermal dissipation property to be formed, and a method for producing the same. It is another object of the present invention to provide an inexpensive circuit board, which allows high-density mounting and is excellent in noise resistance and a thermal dissipation property, and a method for producing the same.

In order to achieve the above-mentioned object, the capacitor-mounted metal foil of the present invention is provided with a metal foil and a plurality of capacitors formed on the metal foil, and each of the capacitors includes: a conductive layer disposed above the metal foil; and a dielectric layer disposed between the metal foil and the conductive layer. Since the above-mentioned capacitor-mounted metal foil includes capacitors, a circuit board excellent in noise resistance can be produced. Furthermore, the capacitor-mounted metal foil is flexible, so that a circuit board can be produced using a resin. Also, an inexpensive circuit board can be produced, which allows high-density mounting and is excellent in a thermal dissipation property.

In the present specification, the term "metal foil" refers to a film, a layer, a sheet, and the like. Furthermore, in the present specification, for easy understanding, the terms "metal foil" and "metal film" are used for another member; however, there is no difference in meaning therebetween.

In the above-mentioned capacitor-mounted metal foil, the capacitor further may include a metal layer disposed between the metal foil and the dielectric layer, and a surface of the metal layer that is in contact with the dielectric layer may be roughened. According to this structure, a capacitor with a large capacitance can be formed. Furthermore, by controlling the degree of roughness, the capacitance of a capacitor can be regulated.

In the above-mentioned capacitor-mounted metal foil, the dielectric layer may be made of an oxide of the metal forming the metal layer. According to this structure, production becomes easy.

In the above-mentioned capacitor-mounted metal foil, the metal layer may be made of a material selected from the group consisting of aluminum, tantalum, and niobium. According to this structure, an aluminum electrolytic capacitor and a tantalum electrolytic capacitor can be formed.

In the above-mentioned capacitor-mounted metal foil, the metal foil and the metal layer may be bonded to each other via a metallic bond. According to this structure, a capacitor-mounted metal foil can be produced, which enables a highly reliable circuit board to be produced.

In the above-mentioned capacitor-mounted metal foil, a thickness of the metal layer may be in a range of 10 $\mu$m to 100 $\mu$m. By prescribing the thickness of the metal layer to be 10 $\mu$m or more, the surface of the metal layer can be roughened easily.

In the above-mentioned capacitor-mounted metal foil, the metal foil may be made of a material selected from the group consisting of copper and nickel. According to this structure, a wiring pattern that is soldered easily at a low resistance can be formed.

In the above-mentioned capacitor-mounted metal foil, a thickness of the metal foil may be in a range of 3 $\mu$m to 70 $\mu$m. It is preferable that the thickness of the metal foil is in a range of about 3 $\mu$m to about 18 $\mu$m for forming a fine wiring pattern. It is preferable that the thickness of the metal foil is 18 $\mu$m or more for mounting a component by soldering. Furthermore, it is preferable that the thickness of the metal foil is in a range of about 35 $\mu$m to about 70 $\mu$m for forming a wiring pattern through which a large current flows. Furthermore, it is preferable that the thickness of the metal foil is in a range of about 18 $\mu$m to about 70 $\mu$m for facilitating handling. Furthermore, it is preferable that the metal foil is thinner for producing a thin circuit board.

In the above-mentioned capacitor-mounted metal foil, the conductive layer may include a conductive polymer layer and an electrode made of metal that are layered successively from the metal foil side. According to this structure, a capacitor having a small equivalent series resistance (hereinafter, it may be referred to as an "ESR") can be produced.

In the above-mentioned capacitor-mounted metal foil, the electrode may be made of at least one metal selected from the group consisting of silver, copper, nickel, and aluminum. According to this structure, since an Ohmic contact can be formed, a capacitor having a small ESR can be produced.

In the above-mentioned capacitor-mounted metal foil, the conductive layer may include a conductive polymer layer and a carbon layer that are layered successively from the metal foil side. According to this structure, since an Ohmic contact can be formed, a capacitor having a particularly small ESR can be produced.

In the above-mentioned capacitor-mounted metal foil, the dielectric layer may be made of a nonconductive polymer. The nonconductive polymer has a low dielectric constant; however, it is easily handled due to its high mechanical strength and is unlikely to be damaged during layering on a substrate.

The above-mentioned capacitor-mounted metal foil further may include a resistor formed on the metal foil. According to this structure, resistors as well as capacitors can be embedded in a circuit board, so that higher density of the circuit board can be obtained.

In the above-mentioned capacitor-mounted metal foil, the plurality of capacitors may be arranged in a grid array shape on the metal foil. According to this structure, flip chip bonding in which a semiconductor is mounted directly can be utilized, whereby a capacitor can be formed immediately under a semiconductor. In addition, a capacitor can be formed immediately under a lead electrode of a chip size package. This will stabilize noise and a power supply voltage.

The above-mentioned capacitor-mounted metal foil may include an insulating polymer layer on a part of the metal foil where no capacitors are formed. According to this structure, the metal foil can be prevented from being damaged during etching or oxidation. Furthermore, by prescribing the height of the insulating polymer layer to be substantially equal to that of the capacitor, mechanical stress can be prevented from being concentrated on the capacitor during pressing and heating of a circuit board. Furthermore, in producing a circuit board, the insulating polymer layer can be used as an adhesive layer.

Furthermore, the circuit board of the present invention includes: an insulating base; a plurality of wiring patterns formed on at least two principal planes of the base; inner vias formed in the base so as to connect the plurality of wiring patterns to each other; and a plurality of capacitors formed on a surface of at least one wiring pattern selected from the plurality of wiring patters, wherein each of the capacitors includes a conductive layer disposed above the at least one wiring pattern and a dielectric layer disposed between the at least one wiring pattern and the conductive layer. This circuit board allows high-density mounting, and is inexpensive and excellent in noise resistance and a thermal dissipation property. In particular, in this circuit board, the capacitors are connected to the wiring patterns through the inner vias, which is very effective for reduction of noise in a high-frequency circuit, and high-density mounting of circuit components. Furthermore, in the circuit board, the capacitors can be connected in the thickness direction of the board, so that an ESL (Equivalent Series Inductance) can be decreased. In the present specification, the phrase "to connect the plurality of wiring patterns to each other" also indicates an indirect connection via the capacitors.

In the above-mentioned circuit board, the plurality of wiring patterns may include a wiring pattern formed in the base. According to this structure, a circuit board is obtained in which wiring patterns are formed in multi-layers. This allows miniaturized high-density mounting with a high degree of freedom of wiring pattern.

In the above-mentioned circuit board, the capacitor further may include a metal layer disposed between the at least one wiring pattern and the dielectric layer, and a surface of the metal layer that is in contact with the dielectric layer may be roughened.

In the above-mentioned circuit board, the dielectric layer may be made of an oxide of the metal forming the metal layer.

In the above-mentioned circuit board, the metal layer may be made of a material selected from the group consisting of aluminum, tantalum, and niobium.

In the above-mentioned circuit board, the at least one wiring pattern and the metal layer may be bonded to each other via a metallic bond.

In the above-mentioned circuit board, the at least one wiring pattern may be made of a material selected from the group consisting of copper and nickel.

In the above-mentioned circuit board, the conductive layer may include a conductive polymer layer and an electrode made of metal that are layered successively from the at least one wiring pattern side.

In the above-mentioned circuit board, the electrode may be made of at least one metal selected from the group consisting of silver, copper, nickel, and aluminum.

In the above-mentioned circuit board, the conductive layer may include a conductive polymer layer and a carbon layer that are layered successively from the at least one wiring pattern side.

In the above-mentioned circuit board, the dielectric layer may be made of a nonconductive polymer.

The above-mentioned circuit board further may include a resistor disposed between wires of the at least one wiring pattern.

In the above-mentioned circuit board, the plurality of capacitors may be arranged in a grid array shape on the at least one wiring pattern. According to this structure, a power supply circuit and a signal circuit that require capacitors can be connected easily.

In the above-mentioned circuit board, all of the plurality of capacitors may be connected to the inner vias.

In the above-mentioned circuit board, the base may include a thermosetting resin and an inorganic filler. According to this structure, a circuit board having a high thermal dissipation property can be obtained. Furthermore, according to this structure, physical properties of the base can be made uniform, so that a highly reliable circuit board can be obtained.

In the above-mentioned circuit board, the base may include a thermosetting resin and reinforce. According to this structure, conventionally used materials for a circuit board can be used.

Furthermore, the method for producing a capacitor-mounted metal foil of the present invention is a method for producing a capacitor-mounted metal foil provided with a metal foil and a plurality of capacitors formed on the metal foil, including: (a) forming a metal layer disposed on a part of the metal foil and a dielectric layer disposed on the metal layer; and (b) forming a conductive layer on the dielectric layer. According to this production method, the capacitor-mounted metal foil of the present invention can be produced easily.

In the above-mentioned method for producing a capacitor-mounted metal foil, the dielectric layer may be made of an oxide of the metal forming the metal layer. According to this structure, the capacitor-mounted metal foil of the present invention can be produced easily.

In the above-mentioned method for producing a capacitor-mounted metal foil, the process (a) may include: (a-1) forming a metal film on the metal foil; (a-2) roughening a surface of a part of the metal film; (a-3) oxidizing the roughened surface of the metal film to form the metal layer and the dielectric layer; and removing a part of the metal film after the process (a-1). According to this structure, a capacitor with a large capacitance can be produced easily.

In the above-mentioned method for producing a capacitor-mounted metal foil, the process (a-1) may be conducted by hot rolling or cold rolling, and the metal foil and the metal film may be bonded to each other via a metallic bond.

In the above-mentioned method for producing a capacitor-mounted metal foil, the process (a-2) may be conducted by at least one method selected from the group consisting of chemical etching, electrochemical etching, and sandblasting. According to this structure, the surface of the metal film can be roughened easily.

In the above-mentioned method for producing a capacitor-mounted metal foil, in the process (a-3), the surface of the metal film may be oxidized by anodization. According to this structure, a uniform and stable oxide layer can be formed.

In the above-mentioned method for producing a capacitor-mounted metal foil, the metal film may be made of a material selected from the group consisting of aluminum, tantalum, and niobium.

In the above-mentioned method for producing a capacitor-mounted metal foil, the metal foil may be made of a material selected from the group consisting of copper and nickel.

In the above-mentioned method for producing a capacitor-mounted metal foil, the process (a) may include forming an insulating polymer layer on a part of the metal foil where the metal layer is not formed.

In the above-mentioned method for producing a capacitor-mounted metal foil, the process (a) may include forming a metal layer on a part of the metal foil, and forming the dielectric layer made of a nonconductive polymer on the metal layer.

In the above-mentioned method for producing a capacitor-mounted metal foil, the conductive layer may include a conductive polymer layer and an electrode made of metal successively layered from the metal foil side.

The above-mentioned method for producing a capacitor-mounted metal foil further may include forming a resistor connected to the metal layer.

Furthermore, the method for producing a circuit board of the present invention is a method for producing a capacitor-embedded circuit board, including: (i) forming capacitors on a metal foil; (ii) laminating a prepreg in which inner vias are formed and the metal foil on each other so that the capacitors are embedded in the prepreg; (iii) curing the prepreg; and (iv) removing a part of the metal foil to form a wiring pattern, wherein the process (i) includes (a) forming a metal layer disposed on a part of the metal foil and a dielectric layer disposed on the metal layer and (b) forming a conductive layer on the dielectric layer. According to this method for producing a circuit board, the circuit board of the present invention can be produced easily.

In the above-mentioned method for producing a circuit board, the dielectric layer may be made of an oxide of the metal forming the metal layer.

In the above-mentioned method for producing a circuit board, the process (a) may include: (a-1) forming a metal film on the metal foil; (a-2) roughening a surface of a part of the metal film; (a-3) oxidizing the roughened surface of the metal film, thereby forming the metal layer and the dielectric layer; and removing a part of the metal film after the process (a-1).

In the above-mentioned method for producing a circuit board, the metal film may be made of a material selected from the group consisting of aluminum, tantalum, and niobium.

In the above-mentioned method for producing a circuit board, the metal foil may be made of a material selected from the group consisting of copper and nickel.

In the above-mentioned method for producing a circuit board, the prepreg may include a metal film on a surface opposite to a surface that is in contact with the metal foil, and the process (iii) may include curing the prepreg, and electrically connecting the capacitors to the metal film.

The above-mentioned method for producing a circuit board further may include forming a wiring pattern on a surface of the prepreg after the process (iii).

The above-mentioned method for producing a circuit board may include layering the metal foil, on which the capacitors are formed in the process (i), and the prepreg on the base obtained in the process (iv) to form a multi-layer board. According to this structure a circuit board provided with multi-layer wiring patterns can be produced.

In the above-mentioned method for producing a circuit board, the inner vias may be formed by filling through-holes in the prepreg with a conductive paste. According to this structure, when the capacitors are embedded in the prepreg, the dielectric layer can be prevented from being damaged.

These and other advantages of the present invention will become apparent to those skilled in the art upon reading and understanding the following detailed description with reference to the accompanying figures.

BRIEF DESCRIPTION OF THE DRAWINGS

FIGS. 6A to 6E show an exemplary method for producing a circuit board of the present invention.

DESCRIPTION OF THE PREFERRED EMBODIMENTS

Hereinafter, the present invention will be described by way of illustrative embodiments with reference to the drawings. It should be noted that the present invention is not limited to the embodiments described below. It also should be noted that the drawings used below are schematic and therefore simplified if required.

Embodiment 1

In Embodiment 1, an example of a capacitor-mounted metal foil of the present invention will be described.

Figure 1A:
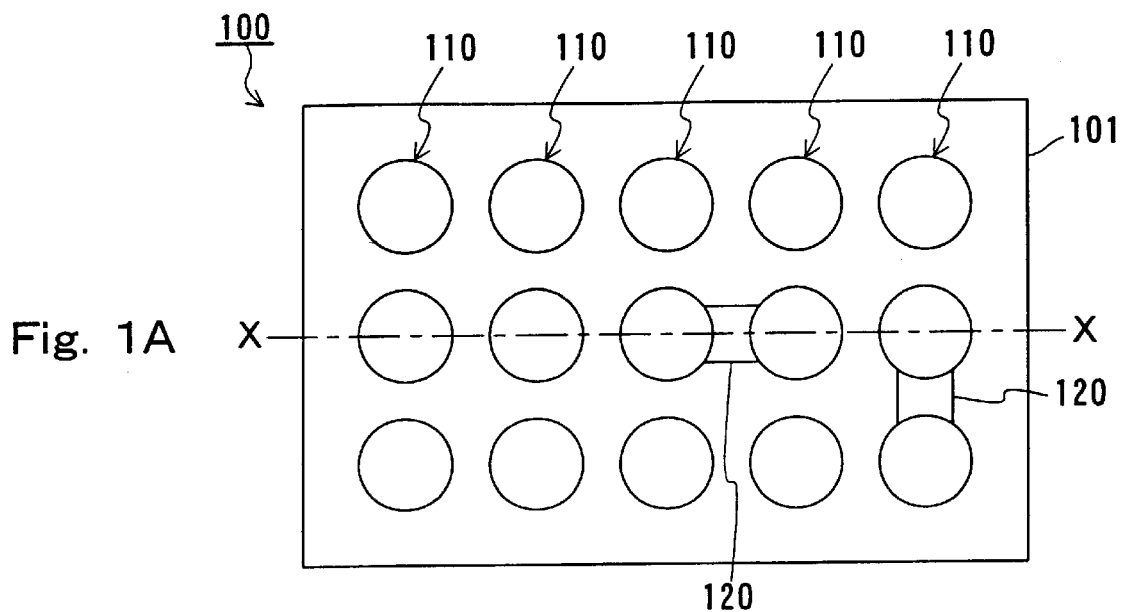
FIG. 1A is a plan view of an example of a capacitor-mounted metal foil of the present invention.
Figure 1B:
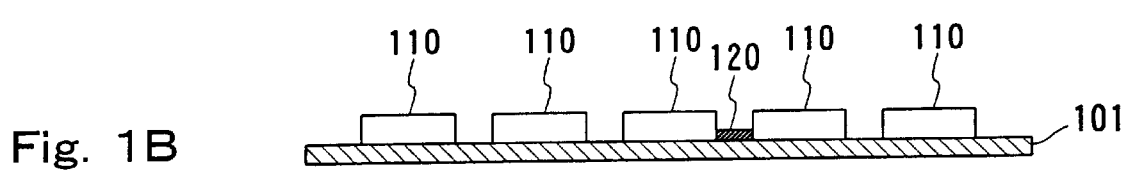
FIG. 1B is a cross-sectional view thereof.

FIG. 1A is a plan view of a capacitor-mounted metal foil 100 in Embodiment 1, and FIG. 1B is a cross-sectional view taken along line X—X in FIG. 1A.

Referring to FIGS. 1A and 1B, the capacitor-mounted metal foil 100 includes a metal foil 101, a plurality of capacitors 110 (hatching is omitted) formed on the metal foil 101, and resistors 120. FIG. 1A shows a case where a plurality of capacitors 110 are arranged in a grid array shape; however, the capacitors 110 may be arranged in a different manner.

Figure 1C:
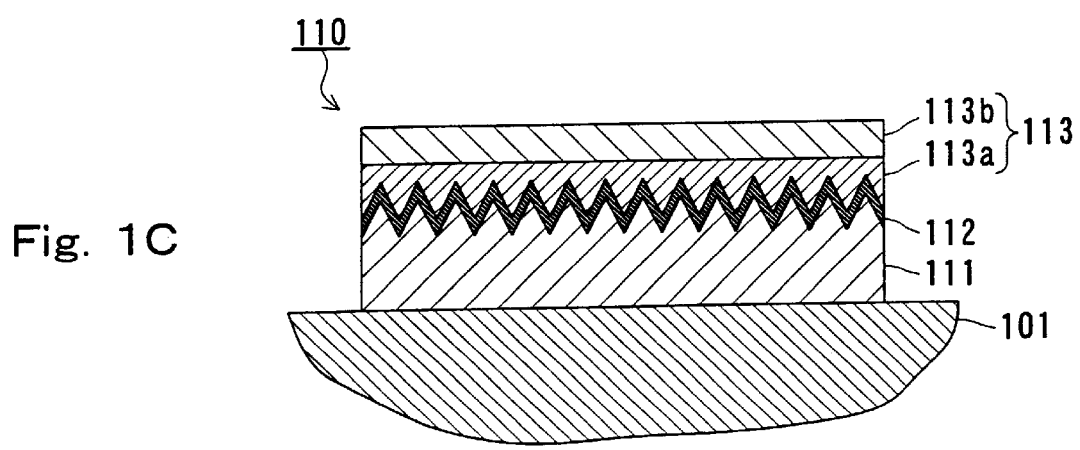
FIG. 1C is an enlarged cross-sectional view of a capacitor portion.

FIG. 1C shows an enlarged view of the capacitor 110. The capacitor 110 is a solid-state electrolytic capacitor. The capacitor 110 includes a metal layer 111, a dielectric layer 112, and a conductive layer 113 formed on the metal foil 101 in this order from the metal foil 101 side.

The metal foil 101 is made of, for example, a metal material forming a wiring pattern of a circuit board. More specifically, the metal foil 101 can be made of copper or nickel. In the case of a copper foil, it is preferable to use a rolled copper foil, which has a low resistance and is easy to handle. It is preferable that the thickness of the metal foil 101 is in a range of 3 µm to 70 µm.

The metal layer 111 functions as an electrode (anode) of the capacitor 110. The metal layer 111 can be made of, for example, aluminum, tantalum, or niobium. The thickness of the metal layer 111 is preferably in a range of 10 µm to 100 µm.

It is preferable that the surface of the metal layer 111 that is in contact with the dielectric layer 112 is roughened so as to increase a contact area. The surface roughness of the metal layer 111 can be represented, for example, in an area percentage. Herein, the area percentage refers to a value that represents how many times greater the surface area after roughening becomes with respect to the surface area before roughening in the case where a predetermined area of a smooth surface is roughened. As the surface area percentage of the metal layer 111 becomes higher, a capacitor with a larger capacitance can be obtained. In general, it is preferable that the area percentage (ratio between the surface area before roughening and the surface area after roughening) is 10 times or more.

It is preferable that the metal foil 101 and the metal layer 111 are bonded to each other via a metallic bond. More specifically, it is preferable to use a clad material formed by hot rolling or cold rolling as the metal foil 101 and the metal layer 111.

The dielectric layer 112 may be made of, for example, an oxide of the metal forming the metal layer 111. More specifically, a layer made of aluminum oxide, tantalum oxide, or niobium oxide can be used as the dielectric layer 112. By using aluminum oxide for the dielectric layer 112, an aluminum electrolytic capacitor can be formed. By using tantalum oxide for the dielectric layer 112, a tantalum electrolytic capacitor can be formed. Furthermore, the dielectric layer 112 may be made of a nonconductive polymer. Examples of the nonconductive polymer forming the dielectric layer 112 include a polymer of polyimide, acrylic resin, and polyphenylene sulfide. Although the thickness of the dielectric layer 112 is not particularly limited, it may be in a range of 2 nm to 2 µm, for example.

The conductive layer 113 functions as an electrode (negative electrode) of the capacitor 110. The conductive layer 113 includes a conductive polymer layer 113a and an electrode 113b made of metal successively layered from the metal foil 101 side. The conductive polymer layer 113a has a function of substantially increasing a contact area between the dielectric layer 112 and the electrode 113b. More specifically, the conductive polymer can be made of polypyrrole, for example. The electrode 113b can be made of at least one metal selected from the group consisting of silver, copper, nickel, and aluminum. Furthermore, a carbon electrode may be used in place of the electrode 113b made of metal. The conductive layer 113 may have a layer made of carbon particles disposed between the conductive polymer layer 113a and the electrode 113b.

The resistors 120 are formed, for example, so as to connect a plurality of capacitors 110 to each other across the metal layer 111. The resistors 120 can be made of a paste in which conductive powder is dispersed in a thermosetting resin such as epoxy resin.

As described in the following embodiments, the capacitor-mounted metal foil of the present invention may be provided with an insulating polymer layer on a part of the metal foil 101 where the capacitors 110 are not formed.

Furthermore, in the capacitor-mounted metal foil and the circuit board of the present invention, the shape and arrangement of capacitors, and the presence/absence of resistors and an insulating polymer layer can be selected arbitrarily.

Embodiment 2

In Embodiment 2, an example of a circuit board of the present invention will be described. The same components as those in Embodiment 1 are denoted with the same reference numerals as those therein, and the description of the overlapping components will be omitted here (this also applies to the subsequent embodiments).

Figure 2A:
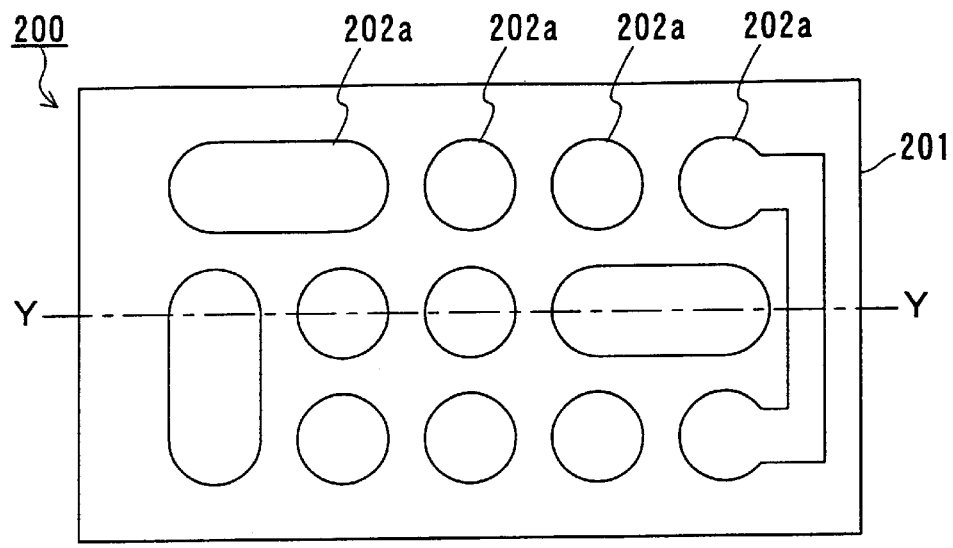
FIG. 2A is a plan view of an example of a circuit board of the present invention.
Figure 2B:
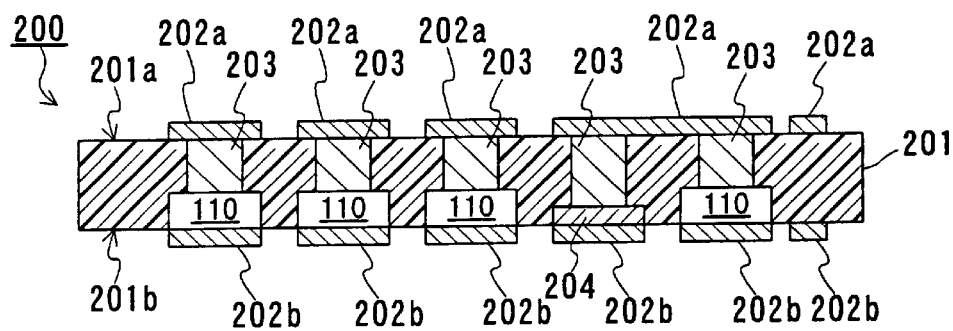
FIG. 2B is a cross-sectional view thereof.

FIG. 2A shows a plan view of an example of a circuit board 200 in Embodiment 2, and FIG. 2B shows a cross-sectional view taken along line Y—Y in FIG. 2A.

Referring to FIGS. 2A and 2B, the circuit board 200 includes an insulating base 201, two wiring patterns 202a and 202b formed on two principal planes of the base 201, inner vias 203 formed in the base 201, and a plurality of capacitors 110 formed on the wiring pattern 202b. The capacitor 110 is the same as that described in Embodiment 1.

The base 201 is made of an insulating material. For example, the base 201 may be made of a thermosetting resin mixed with an inorganic filler (powder made of a inorganic substance). The base 201 also may be made of reinforce impregnated with a thermosetting resin.

A plurality of wiring patterns 202 (202a and 202b) are formed on two principal planes 201a and 201b of the base 201. As described below, a plurality of wiring patterns 202 further may include a wiring pattern formed in the base 201. The wiring patterns 202 can be made of a material used for general electric wiring, such as copper and nickel. The wiring pattern 202*b*, on which the capacitors 110 are formed, can be formed easily by etching the metal foil 101 of the capacitor-mounted metal foil.

The inner vias 203 are disposed in the base 201 in such a manner that the wiring pattern 202*a* and the wiring pattern 202*b* are electrically connected to each other in a direct or indirect manner. The inner vias 203 can be formed, for example, by filling holes formed in the base 201 with a conductive paste. As the conductive paste, a mixture of metal powder of gold, silver, copper, nickel, or tin and a thermosetting resin can be used. More specifically, a conductive paste can be used, in which 80 to 90% by weight of metal powder is mixed with epoxy resin. Copper powder is likely to be oxidized; however, it has excellent electrical conductivity and resistance to migration. Furthermore, silver powder is excellent in electrical conductivity.

The capacitors 110 may be arranged in a grid array shape as shown in FIG. 1A or may be arranged in an arbitrary position (this also applies to the subsequent embodiments). FIG. 2B shows an example in which the capacitors 110 are arranged in a grid array shape, and a metal layer 204 is disposed in place of the capacitors 110 in some of the grid-points.

The circuit board 200 may be provided with the resistors 120 formed so as to connect the metal layers 111 of a plurality of capacitors 110 to each other. If required, all the capacitors 110 may be connected to the inner vias 203.

Embodiment 3

In Embodiment 3, another example of a circuit board of the present invention will be described. The circuit board 300 in Embodiment 3 is different from that in Embodiment 2 in that three-layer wiring patters are provided. Therefore, the overlapping description will be omitted here.

Figure 3:
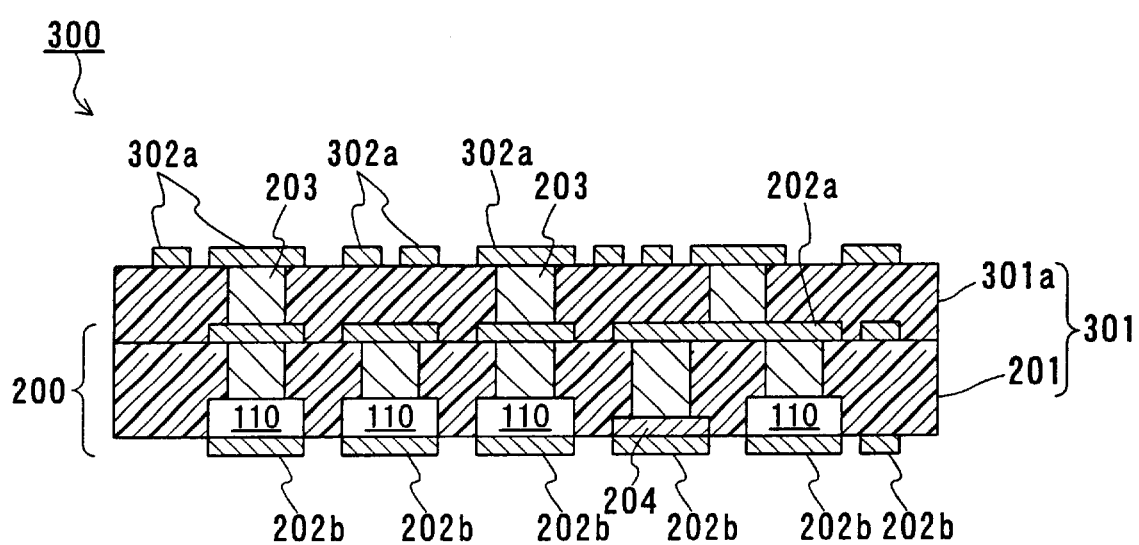
FIG. 3 is a cross-sectional view of another example of a circuit board of the present invention.

FIG. 3 shows a cross-sectional view of the circuit board 300. Referring to FIG. 3, the circuit board 300 includes an insulating base 301, a plurality of wiring patterns 202*a*, 202*b*, and 302*a*, inner vias 203 formed in the base 301, and a plurality of capacitors 110 formed on the wiring pattern 202*b*. The circuit board 300 is obtained by layering an insulating base 301*a* on the circuit board 200 described in Embodiment 2 and forming the wiring pattern 302*a* thereon.

The circuit board 300 includes three-layer wiring patterns. The wiring patterns 302*a* and 202*b* are formed on two principal planes of the base 301. The wiring pattern 202*a* is disposed in the base 301.

The wiring pattern 302*a* is the same as the wiring pattern 202*a* described in Embodiment 2.

The number of wiring patterns included in the circuit board of the present invention is not particularly limited. Furthermore, in the circuit board of the present invention, the capacitors 110 may be formed on a plurality of wiring patterns.

Embodiment 4

In Embodiment 4, an example of a method for producing a capacitor-mounted metal foil of the present invention will be described. According to the production method in Embodiment 4, a capacitor-mounted metal foil of the present invention can be produced easily. It should be noted that the components denoted with the same reference numerals as those in the above embodiments can be made of the materials described in the above embodiments.

Figure 4A:
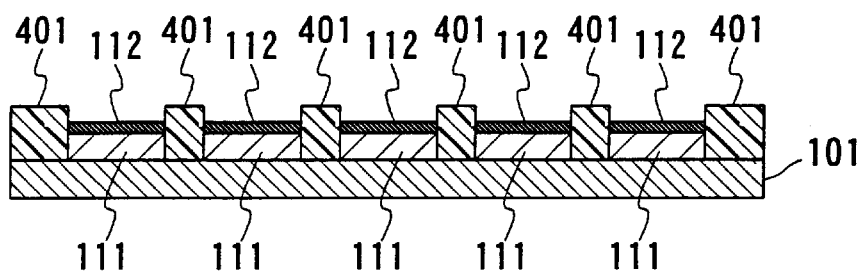
FIGS. 4A and 4B show an exemplary method for producing a capacitor-mounted metal foil of the present invention.
Figure 4B:
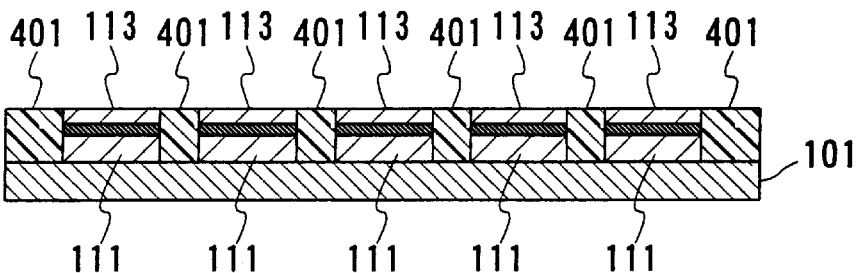

FIGS. 4A and 4B show an example of the production method in Embodiment 4. According to the production method in Embodiment 4, as shown in FIG. 4A, a metal layer 111 disposed on a part of a metal foil 101 and a dielectric layer 112 disposed on a metal layer 111 are formed (Process (a)). An insulating polymer layer 401 is formed on a part of the metal foil 101 where no metal layer 111 is formed. It is preferable that the height of the insulating polymer layer 401 is set to be substantially equal to that of a capacitor to be formed.

Figure 5A:
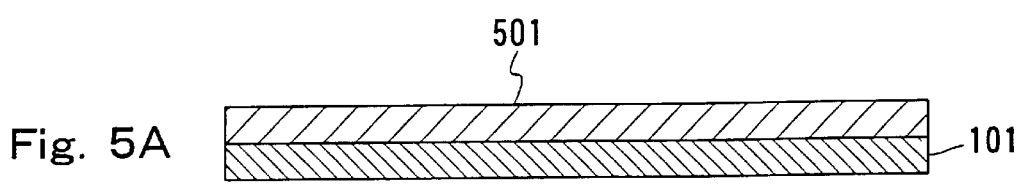
FIGS. 5A to 5D show part of an exemplary method for producing a capacitor-mounted metal foil of the present invention.

The metal layer 111 and the dielectric layer 112 can be formed by various methods. FIGS. 5A to 5D show an exemplary procedure in which the dielectric layer 112 is made of metal forming the metal layer 111. First, as shown in FIG. 5A, a metal film 501 to be the metal layer 111 is formed on the metal foil 101. The metal film 501 can be formed by vapor deposition, sputtering, or plating. The metal foil 101 bonded to the metal film 501 via a metallic bond may be formed by hot rolling or cold rolling. A metal layer to be the metal foil 101 may be formed on a metal foil to be the metal layer 111 as described in Example 1.

Figure 5B:
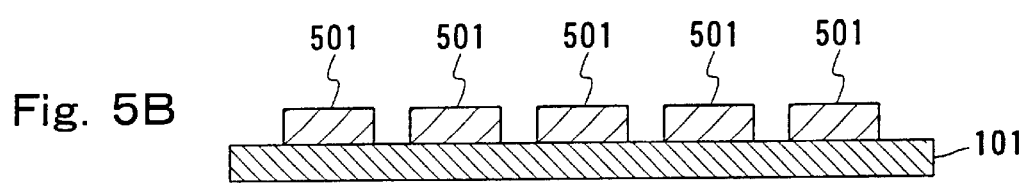

Next, as shown in FIG. 5B, a part of the metal film 501 is removed. This can be conducted by forming a resist film on the metal film 501 and etching a part of the metal film 501. In the case where the metal film 501 is made of aluminum, the metal film 501 with the resist film formed thereon should be soaked in a hydrochloric acid aqueous solution with a concentration of about 7%. In a hydrochloric acid aqueous solution with this concentration, although aluminum is dissolved, copper is hardly dissolved.

Figure 5C:
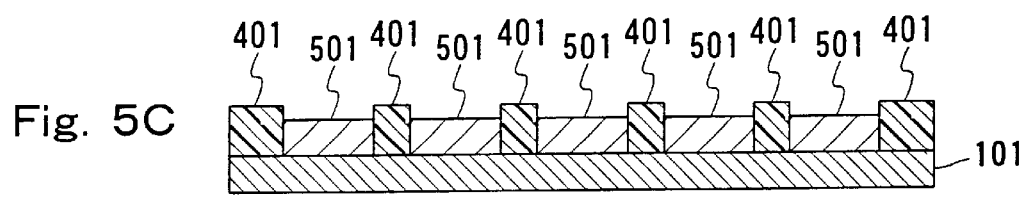

Next, as shown in FIG. 5C, after the insulating polymer layer 401 is formed on a part of the metal foil 101 where no metal film 501 is formed, the surface of the metal film 501 is roughened (in the figure, unevenness of the surface is not shown). Roughening can be conducted using, for example, at least one method selected from the group consisting of chemical etching, electrochemical etching, and sandblasting. More specifically, a direct-current electrochemical etching can be used. According to this method, columnar pits are formed, so that a roughness degree (surface area) can be increased. Furthermore, by conducting alternating-current etching, using a hydrochloric acid aqueous solution, the roughness degree can be increased further. According to these etching methods, the roughness degree can be controlled by regulating the length of the columnar pits and the thickness of the metal foil 101. A resist film and the like can be used for the insulating polymer layer 401.

Figure 5D:
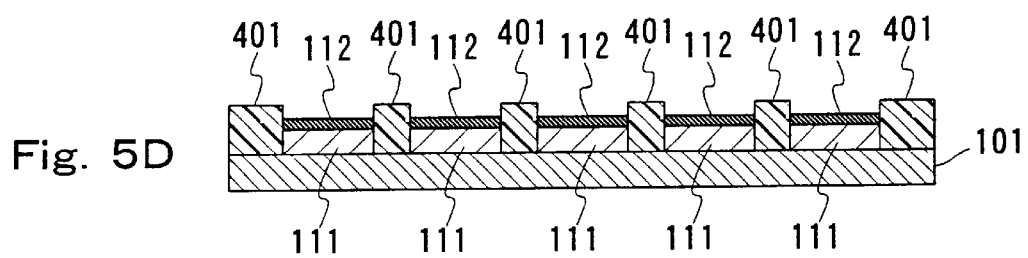

Next, as shown in FIG. 5D, the surface of the metal film 501 is oxidized by anodization, whereby the metal layer 111 and the dielectric layer 112 can be formed. At this time, the surface of the metal film 501 can be oxidized to a uniform thickness. In this way, the metal layer 111 and the dielectric layer 112 can be formed.

Partial etching of the metal film 501 may be conducted in any stage as long as it is conducted after forming the metal film 501. Furthermore, the insulating polymer layer 401 may be formed in any stage as long as it is after partial etching of the metal film 501 and before anodization, or may be omitted. For example, roughening of the surface of the metal film 501, partial etching of the metal film 501, formation of the insulating polymer layer 401, and anodization may be performed in this order.

In the case where the dielectric layer 112 is made of a nonconductive polymer, after the metal layer 111 whose surface has been roughened is formed, a nonconductive polymer should be electrodeposited, coated, or sprayed onto the metal layer 111.

After Process (a) described with reference to FIG. 4A, a conductive layer 113 is formed on the dielectric layer 112, as shown in FIG. 4B (Process (b)). In the conductive layer 113, the conductive polymer layer 113a (see FIG. 1B) can be formed, for example, by coating a conductive polymer agent dissolved in a solvent onto the dielectric layer 112 by screen printing. Alternatively, after a resist is formed in a part other than the dielectric layer 112, a conductive polymer agent dissolved in a solvent may be coated onto the dielectric layer 112 by spin coating. The electrode 113b can be formed by vapor deposition, sputtering, or coating of a conductive paste. Furthermore, a layer made of carbon can be formed by screen printing or spin coating, using a carbon paste dispersed in a solvent, in the same way as in the conductive polymer layer 113a.

As described above, according to the production method in Embodiment 4, the capacitor-mounted metal foil of the present invention can be formed.

Embodiment 5

In Embodiment 5, an example of a method for producing a circuit board of the present invention will be described. FIGS. 6A to 6E show a procedure of a method for producing a circuit board in Embodiment 5.

First, as shown in FIG. 6A, capacitors 610 are formed on a metal foil 601 to obtain a capacitor-mounted metal foil 600 (Process (i)). FIG. 6A shows an example in which the capacitors 610, a metal layer 603, and an insulating polymer layer 604 are formed on the metal foil 601. The capacitor-mounted metal foil 600 is a capacitor-mounted metal foil of the present invention. Process (i) includes a method for producing a capacitor-mounted metal foil described in Embodiment 4. More specifically, Process (i) includes Process (a) of forming a metal layer disposed on a part of a metal foil and a dielectric layer disposed on the metal layer, and Process (b) of forming a conductive layer on the dielectric layer.

Next, as shown in FIG. 6B, a prepreg 606 in which inner vias 605 are formed in through-holes is aligned with the capacitor-mounted metal foil 600. The inner vias 605 can be formed by filling the through-holes with a conductive paste.

Next, as shown in FIG. 6C, the prepreg 606 is laminated on the capacitor-mounted metal foil 600 so that the capacitors 610 are embedded in the prepreg 606 (Process (ii)). Furthermore, concurrently with or after Process (ii), a metal film 607 is formed on the prepreg 606. More specifically, the capacitor-mounted metal foil 600, the prepreg 606, and the metal film (metal foil) 607 are overlapped with each other, and the layered structure should be subjected to hot pressing while being interposed between SUS plates. Hot pressing can be conducted under the conditions of a temperature of 175° C. to 260° C. and a pressure of 196 to 490 N/cm² (20 to 50 kgf/cm²).

The prepreg 606 can be formed by mixing an inorganic filler and an uncured thermosetting resin in a solvent and drying the mixture to evaporate the solvent to form a sheet. As the inorganic filler, powder made of an inorganic substance such as $Al_2O_3$, $SiO_2$, MgO, and AlN can be used. As the thermosetting resin, epoxy resin, phenol resin, cyanate resin, polyphenylene ether resin, or the like can be used. A prepreg obtained by using an inorganic filler and a thermosetting resin have high thermal conductivity, so that heat generated during mounting of components can be released rapidly by using such a prepreg. In view of thermal conductivity, $Al_2O_3$ and AlN are particularly preferable. Furthermore, since $SiO_2$ has a small dielectric constant, a circuit board excellent in high-frequency characteristics can be obtained by using $SiO_2$. Furthermore, $SiO_2$ has a small thermal expansion coefficient; therefore, the thermal expansion coefficient of a board can be matched with that of a semiconductor by controlling the added amount of $SiO_2$, whereby a highly reliable circuit board can be produced easily.

The prepreg 606 may be formed by impregnating woven fabric or reinforce with uncured epoxy resin dissolved in a solvent, followed by drying to obtain a sheet. As the woven fabric or reinforce, those which are made of glass fibers or organic fibers can be used. By using glass fibers, a strong circuit board with a high modulus of elasticity can be obtained. Furthermore, since organic fibers can be subjected to laser processing easily, the use of organic fibers makes it easy to form minute vias. As the organic fibers, aramid fibers or a liquid crystal polymer can be used.

As the conductive paste for filling the through-holes of the prepreg 606, the materials as described in Embodiment 2 can be used.

After Process (ii), the prepreg 606 is cured (Process (iii)), whereby an insulating base 608 is formed as shown in FIG. 6D. More specifically, the prepreg 606 is heated, whereby the thermosetting resin therein is cured. At this time, the inner vias 605 also are cured. The capacitor-mounted metal foil 600, the metal film 607, and the inner vias 605 are electrically connected to each other. The capacitor-mounted metal foil 600, the metal film 607, and the prepreg 606 are bonded to each other.

Thereafter, as shown in FIG. 6E, a part of the capacitor-mounted metal foil 600 is removed, whereby a wiring pattern 609b is formed (Process (iv)). Similarly, a part of the metal film 607 is removed, whereby a wiring pattern 609a is formed. The wiring pattern 609a may be formed directly without using the metal film 607.

The wiring patterns can be formed by a general etching method. More specifically, a mask pattern is formed by using a dry film resist on the metal foil 601 and the metal film 607, and unwanted parts should be removed by using a copper chloride aqueous solution.

In this manner, a circuit board 720 of the present invention can be produced. According to the method for producing a circuit board in Embodiment 5, the circuit board of the present invention described in Embodiment 2 can be produced easily.

In the case where a circuit board provided with three or more layered wiring patterns is produced, a prepreg or a multi-layer circuit board should be further laminated on the circuit board 720 produced above, as described in the following examples.

The method for producing a circuit board provided with capacitors, using a prepreg, has been described. However, a base may be formed directly on a metal foil on which capacitors are formed, by using an insulating material. As the insulating material, a mixture of the above-mentioned inorganic filler and thermosetting resin can be used. For example, it may be possible that an uncured liquid mixture is coated onto a capacitor-mounted metal foil by roll coating or screen printing, holes are formed by laser processing, and the holes thus formed are filled with a conductive paste.

Furthermore, considering the case where a dielectric layer made of a metal oxide is degraded by heat treatment after a prepreg is laminated, after the above-mentioned processes, aging processing may be conducted for the purpose of insulating the surface of the metal layer again. In this case, according to this treatment, a leak current of capacitors is reduced.

EXAMPLES

Hereinafter, the present invention will be described in more detail by way of illustrative examples.

Example 1

In Example 1, a case will be described in which a capacitor-mounted metal foil of the present invention was produced.

First, as a metal layer for an anode, aluminum (an aluminum foil) (thickness: 50 µm) with a purity of 99.9% or more was prepared. A metal film (thickness: 35 µm) made of copper was formed on the aluminum by electroplating.

Then, the surface of the aluminum was subjected to alternating-current electrochemical etching in a hydrochloric acid solvent with a concentration of 10% by weight at 35° C., whereby the surface was roughened.

Next, the roughened aluminum was etched to a predetermined pattern. More specifically, a resist with a predetermined pattern was formed, and thereafter, a part of the aluminum was dissolved in a hydrochloric acid aqueous solution with a concentration of about 7%. In this manner, a copper film and an aluminum film disposed on the copper film were formed.

Next, a resist film was formed on the copper film exposed by etching of the aluminum film. As the resist film, photosensitive epoxy resin was used. More specifically, a resist film was coated over the entire surface of the copper film, and development was conducted so that the resist film remained only in a part where the aluminum film was removed.

Then, the surface of the aluminum film was anodized, whereby a dielectric layer made of aluminum oxide was formed on the surface of the aluminum film. More specifically, using an aqueous solution of ammonium adipate (with a concentration of 5% by weight at 60° C.) as a forming liquid, the aluminum film was supplied with an anodizing voltage of 12 volts to conduct forming at a constant voltage, whereby the surface of the aluminum film was anodized.

Next, a conductive polymer layer was formed on the dielectric layer made of aluminum oxide. The conductive polymer layer was produced by using a mixed solution of a pyrrol monomer, an oxidant, and a solvent. More specifically, an underlying layer was produced by chemical polymerization, using polypyrrole. Furthermore, electrolytic polymerization was conducted to produce a conductive polymer layer.

Finally, a conductive paste of a mixture containing epoxy resin and a silver filler was printed on the conductive polymer layer by screen printing. The resultant layered structure was cured by heat treatment, whereby an electrode to be a cathodic terminal was formed. Thus, a capacitor-mounted metal foil of the present invention was obtained.

EXAMPLE 2

In Example 2, a case will be described in which a circuit board of the present invention was produced.

Figure 7A:
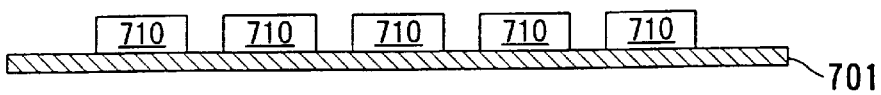
FIGS. 7A to 7D show another exemplary method for producing a circuit board of the present invention.

First, as shown in FIG. 7A, a capacitor-mounted metal foil 701 having capacitors 710 was produced in the same way as in Example 1. In Example 2, the capacitors 710 were placed on the metal foil 701 in a grid array shape with a pitch of 1.0 mm. At this time, an aluminum metal layer was formed in a circular shape with a diameter of 0.5 mm.

Next, a prepreg for a circuit board was produced. As a material for the prepreg for a circuit board, a mixture of an inorganic filler (90% by weight), a thermosetting resin (9.5% by weight), carbon black (0.2% by weight), and a coupling agent (0.3% by weight) was used. As the inorganic filler, spherical $Al_2O_3$ powder (AS-40, produced by Showa Denko, K. K.) with a diameter of 12 µm was used. As the thermosetting resin, liquid epoxy resin (EF-450, produced by Nippon Rec Co., Ltd.) was used. As the carbon black, the one produced by Toyo Carbon Co., Ltd. was used. As the coupling agent, a titanate based coupling agent (Titanate based 46B, produced by Ajinomoto Co., Ltd.) was used.

The above-mentioned materials with their viscosity adjusted by a methyl ethyl ketone solvent (hereinafter, also referred to as an "MEK solvent") was coated onto a polyphenylene sulfide PPS film (thickness: 75 µm) by a doctor blade to form a film. Then, the MEK solvent was evaporated to produce a sheet-shaped prepreg (thickness: 500 µm).

The sheet-shaped prepreg was cut to a predetermined size, and through-holes (via holes) with a diameter of 0.15 mm were formed at an equal interval (with a pitch of 1.0 mm), using a carbon dioxide gas laser. The through-holes were filled with a conductive paste by screen printing. The conductive paste was produced by kneading 85% by weight of spherical copper particles, 3% by weight of bisphenol A epoxy resin (Epicoat 828, produced by Yuka Shell Epoxy), 9% by weight of glycidyl ester based epoxy resin (YD-171, produced by Toto Kasei), and 3% by weight of an amine adduct curing agent (MY-24, produced by Ajinomoto Co., Ltd.), using three rolls.

Figure 7B:
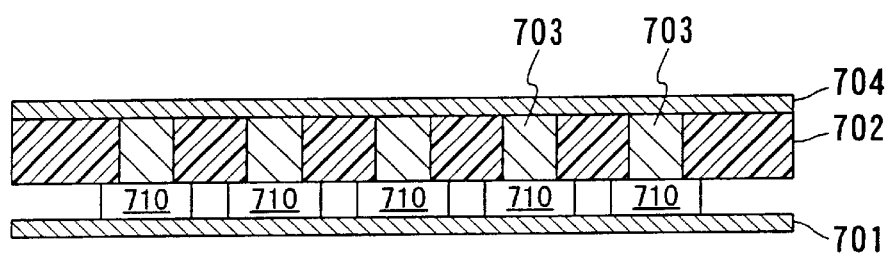

Then, as shown in FIG. 7B, the prepreg 702 was interposed between the capacitor-mounted metal foil 701 and a metal copper foil 704 (thickness: 35 µm), and aligned with each other. As the prepreg 702, the one having inner vias 703 formed of a conductive paste was used.

Figure 7C:
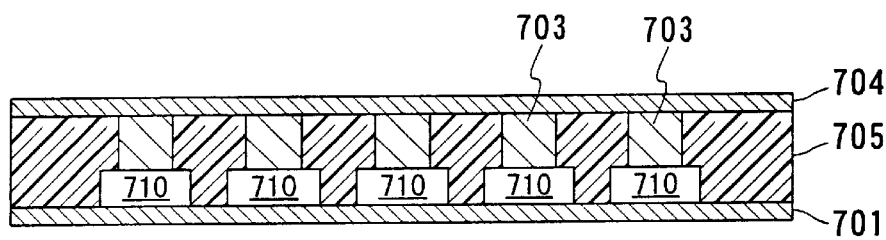

Next, as shown in FIG. 7C, the metal copper foil 704, the prepreg 702, and the capacitor-mounted metal foil 701 were heated under pressure to be integrated with each other under the conditions of 175° C. and 490 N/cm² (50 kg/fcm²). As a result, epoxy resin in the prepreg 702 was cured, and the metal foil 701, the metal copper foil 704, and the prepreg 702 were bonded to each other mechanically. Furthermore, the epoxy resin in the inner vias 703 was cured, and the metal copper foil 704 and the capacitors 710 were electrically connected to each other via the inner vias 703.

Figure 7D:
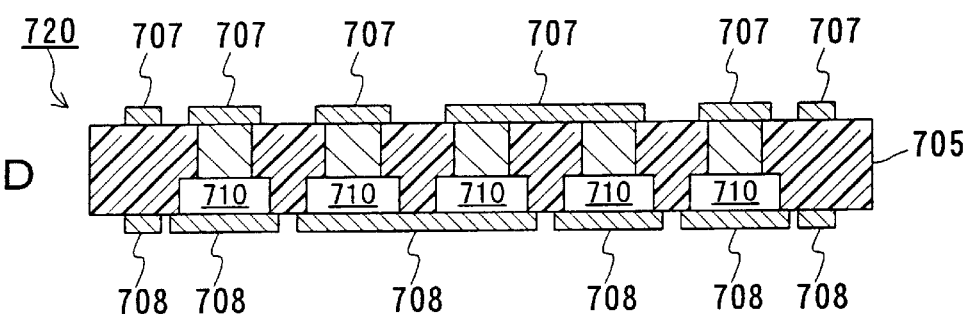

Finally, as shown in FIG. 7D, the metal copper portion of the capacitor-mounted metal foil 701 and the metal copper foil 704 were partially removed by chemical etching, whereby wiring patterns 708 and 707 were formed. Thus, a circuit board 720 of the present invention was produced.

Regarding the circuit board thus produced, each capacitor was measured for characteristics by an impedance analyzer. The capacitors placed in a grid array shape had a capacitance of about 0.3 µF (measurement frequency: 1 MHz). The circuit board thus obtained was provided with capacitors having a high capacitance, so that high-frequency characteristics were satisfactory.

Furthermore, two reliability tests: a temperature cycle test (1000 cycles in total: in each cycle, the circuit board was left standing at −40° C. and +125° C., respectively for 30 minutes) and a moisture-absorbing reflow test (one reflow at 230° C. after the circuit board was left standing at 85° C. and 85% RH for 168 hours) were conducted with respect to the circuit board. In these reliability tests, the capacitor characteristics were hardly changed. Thus, according to the above-mentioned production method, a circuit board can be produced with particularly stable performance by embedding capacitors in the circuit board.

Furthermore, the circuit board using alumina as an inorganic filler had a thermal conductivity of 3.0 W/mK, which was about 20 times or more that of the conventional glass epoxy board. By using AlN or MgO as an inorganic filler, higher conductivity can be realized. Furthermore, by using amorphous $SiO_2$ as an inorganic filler, a circuit board having a thermal expansion coefficient close to that of a silicon semiconductor can be obtained. In this manner, a circuit board is obtained, which is preferable for a flip chip in which a semiconductor is mounted directly on a substrate. In other words, if satisfactory thermal conductivity of AlN is utilized, a circuit board having thermal conductivity close to that of a ceramic substrate can be obtained. Furthermore, by adding BN, a circuit board having high thermal conductivity and low thermal expansion can be obtained. In particular, by using a prepreg containing 90% by weight or more alumina, a capacitor-embedded circuit board having high thermal conductivity can be obtained at a low cost. Furthermore, compared with a circuit board using another inorganic filler, a circuit board using $SiO_2$ as an inorganic filler has a lower dielectric constant and a lower specific gravity, and is preferable as a high-frequency circuit board such as a mobile phone.

By using the circuit board 720 obtained in the present examples, a circuit board having more wiring patterns can be produced.

Figure 8A:
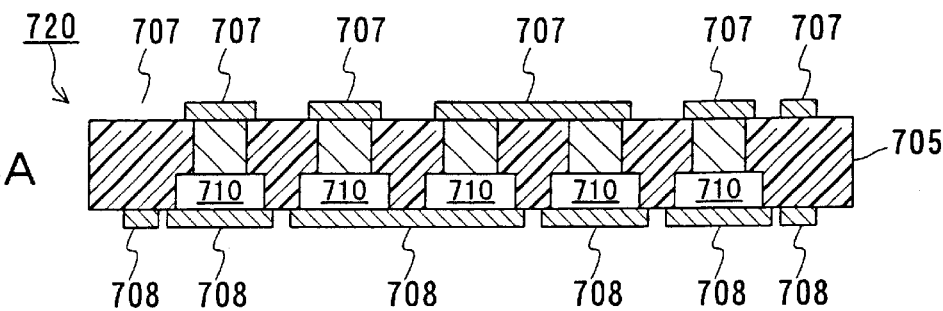
FIGS. 8A to 8C show still another exemplary method for producing a circuit board of the present invention.
Figure 8B:
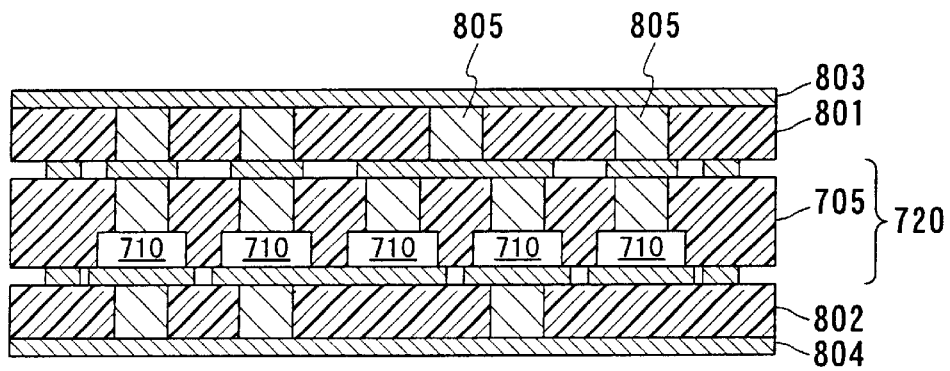

More specifically, the circuit board 720 as shown in FIG. 8A is produced. Then, as shown in FIG. 8B, the circuit board 720 is interposed between prepregs 801 and 802, and metal copper foils 803 and 804. The prepregs 801 and 802 have inner vias 805 formed of a conductive paste.

Figure 8C:
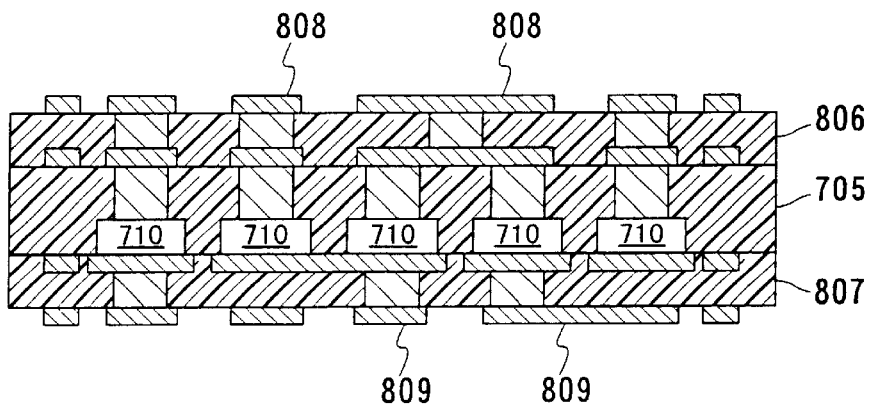

Next, as shown in FIG. 8C, the layered structure is heated under pressure, whereby insulating bases 806 and 807 are formed. At this time, the conductive paste in the inner vias 805 also is cured. Thereafter, a part of the metal copper foils 803 and 804 is etched, whereby electric wirings 808 and 809 are formed. Thus, a circuit board having a four-layer wiring pattern can be produced.

EXAMPLE 3

In Example 3, another case will be described in which a circuit board of the present invention was produced.

Figure 9A:
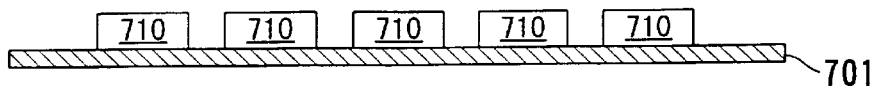
FIGS. 9A to 9E show still another exemplary method for producing a circuit board of the present invention.

First, as shown in FIG. 9A, a capacitor-mounted metal foil 701 provided with capacitors 710 was produced in the same way as in Example 2.

Figure 9B:
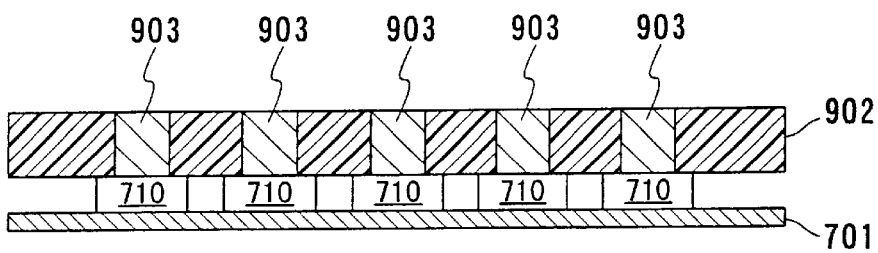

Next, as shown in FIG. 9B, the capacitor-mounted metal foil 701 and a prepreg 902 for a circuit board were aligned with each other. The prepreg 902 has through-holes formed at positions corresponding to the capacitors 710, and inner vias 903 were formed in the through-holes.

Figure 9C:
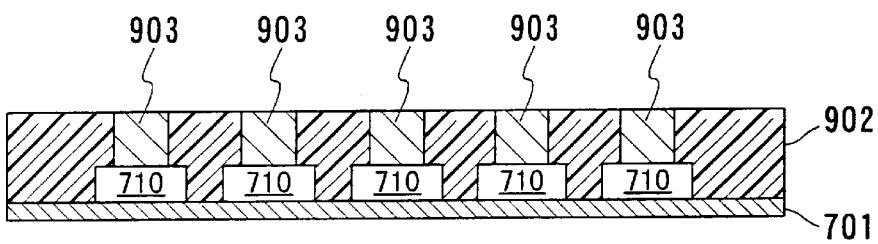

The prepreg 902 was obtained by forming holes in a prepreg (EL-114, produced by Shin-Kobe Electric Machinery Co., Ltd.) by using a carbon dioxide gas laser, and filling the holes with the conductive paste described in Example 2. The prepreg EL-114 has a thickness of 140 μm in which aramid reinforce is impregnated with epoxy resin, Then, as shown in FIG. 9C, the capacitor-mounted metal foil 701 and the prepreg 902 were layered on each other at 100° C. Thus, the epoxy resin in the prepreg 902 was softened, whereby the capacitor-mounted metal foil 701 was bonded to the prepreg 902. Under the heating condition at this time, the thermosetting resin in the prepreg for a circuit board was merely softened, but not cured. It is preferable that heating in this case was conducted in a range of 70° C. to 120° C. When heating is conducted at 70° C. or more, the thermosetting resin is sufficiently softened, so that capacitors can be prevented from being broken by a pressure during layering. Furthermore, when heating is conducted at 120° C. or less, the prepreg can be prevented from being cured in a short period of time.

Figure 9D:
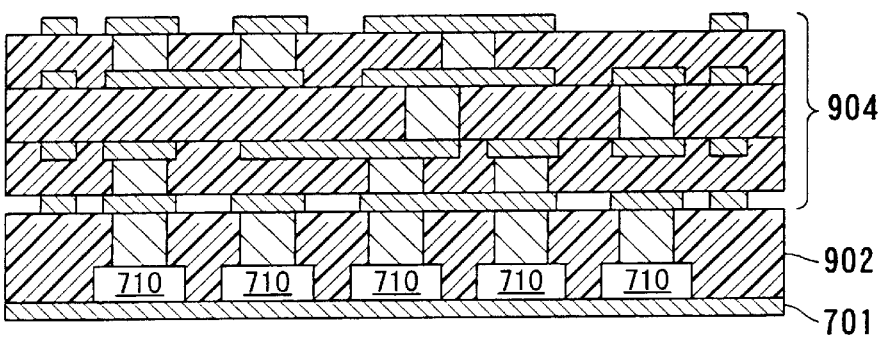

Next, as shown in FIG. 9D, a multi-layer circuit board 904 was aligned with the prepreg 902. As the multi-layer circuit board 904, a general glass epoxy board having four-layer wiring patterns was used. As the multilayer circuit board 904, a through-hole board or a flexible printed board may be used in place of a glass epoxy board.

Figure 9E:
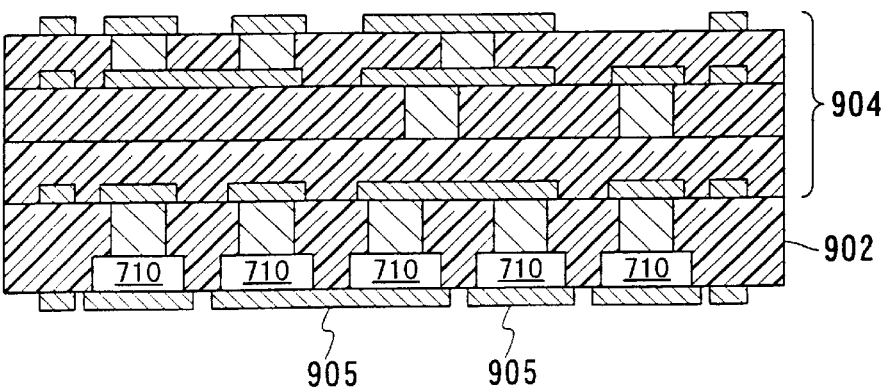

As shown in FIG. 9E, the aligned circuit board 904 and the prepreg 902 were integrated with each other by heating under pressure. A part of the copper foil of the capacitor-mounted metal foil 701 was etched to form a wiring pattern 905. Thus, a multi-layer circuit board with a plurality of capacitors embedded therein was produced.

The circuit board produced by the above method was evaluated for reliability using a solder reflow test and a temperature cycle test. The solder reflow test was conducted by passing the circuit board through a belt-type reflow tester 10 times at 260° C. (maximum temperature) for 10 seconds each. In the temperature cycle test, 200 cycles were conducted. In each cycle, the circuit board was left standing at a −50° C. and 125° C., respectively for 30 minutes. At this time, cracks were not observed in appearance, and no particular abnormality was recognized even in an ultrasonic crack detection apparatus. It was found from these tests that a plurality of capacitors embedded in the circuit board were bonded to the board strongly. Furthermore, the connection resistance of inner vias were hardly changed before and after the tests.

As the multi-layer circuit board 904, a paper phenol board, or an aramid epoxy board may be used in place of a glass epoxy board.

EXAMPLE 4

In Example 4, still another case will be described in which a circuit board of the present invention was produced.

Figure 10A:
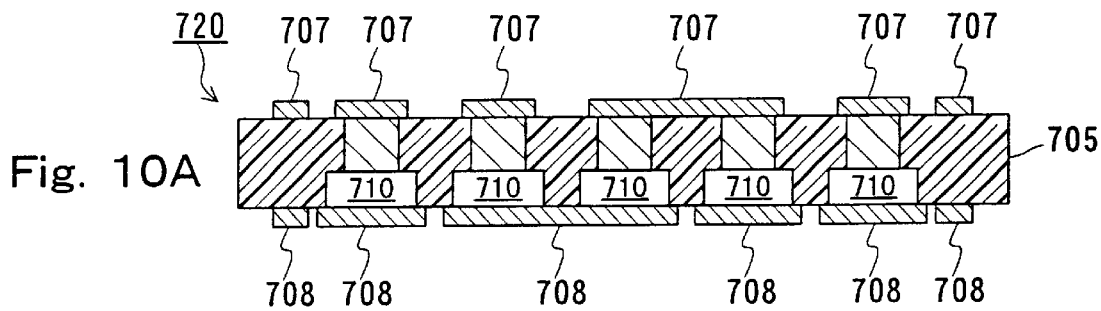
FIGS. 10A to 10E show still another exemplary method for producing a circuit board of the present invention.

First, as shown in FIG. 10A, a circuit board 720 was produced in the same way as in Example 2.

Figure 10B:
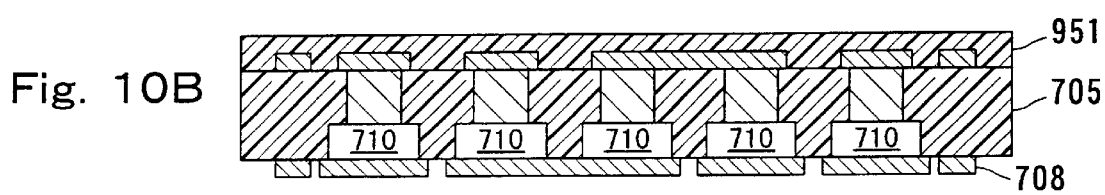

Next, as shown in FIG. 10B, an insulating layer 951 was formed on one side of the circuit board 720. The insulating layer 951 was formed by laminating a photosensitive epoxy resin (Vialux81, produced by Dupont) with a thickness of 50 μm in a dry film shape by a vacuum lamination method. The insulating layer 951 may be formed by coating epoxy resin or polyimide resin by roll coating or screen printing.

Figure 10C:
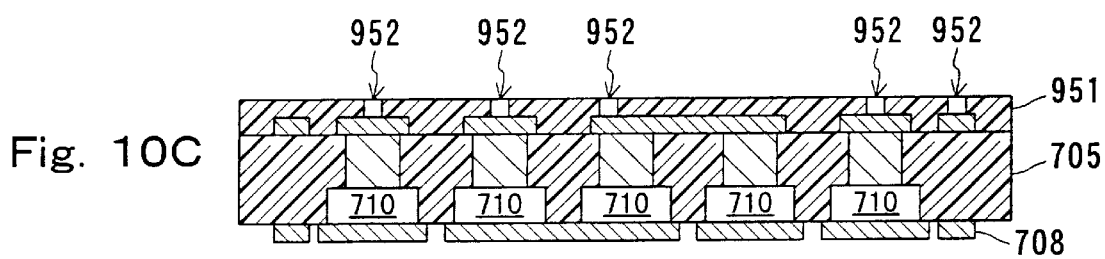

Next, the positions of via holes were exposed to light by using a photographic mask, and developed with a chlorine based solvent, whereby via holes 952 were formed as shown in FIG. 10C. The via holes 952 may be formed by laser processing.

Figure 10D:
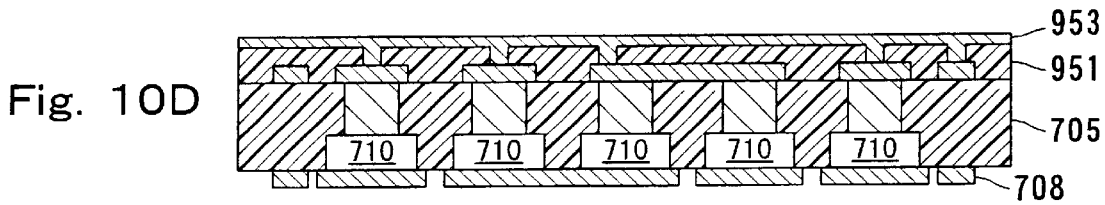

Next, as shown in FIG. 10D, copper was plated to a thickness of 12 μm over the entire surface of the insulating layer 951 by electroless plating, whereby a copper film 953 was formed.

Figure 10E:
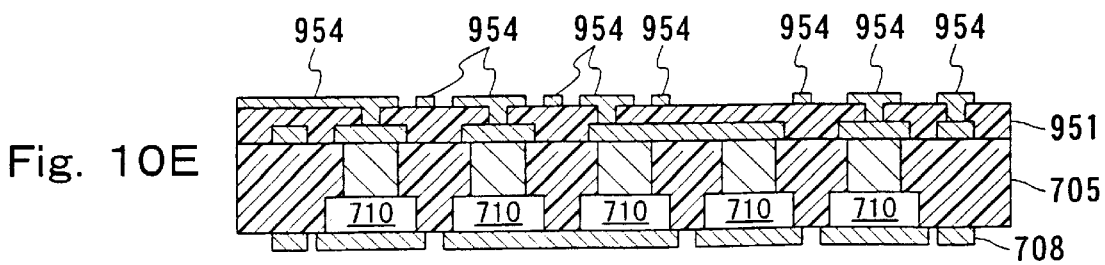

Thereafter, as shown in FIG. 10E, a part of the copper film 953 was removed by photolithography and etching, whereby a wiring pattern 954 was formed. The circuit board thus produced had high reliability.

In the present example, a photosensitive dry film was used for forming the insulating layer 951; however, a liquid insulating resin may be used. Furthermore, in the present example, via holes were formed by photolithography; however, laser processing may be used.

As described above, by using the capacitor-mounted metal foil of the present invention, capacitors absorbing noise and ripple can be embedded easily in a circuit board. Furthermore, the capacitors on the capacitormounted metal foil withstand pressure sufficiently during layering and can be formed at a low temperature. Therefore, they can be embedded easily in a circuit board using a resin.

Furthermore, by forming a base of a circuit board with the use of an inorganic filler and a thermosetting resin, a circuit board having high thermal conductivity can be obtained, which is suitable for mounting a semiconductor and the like. Furthermore, by lowering a dielectric constant of a circuit board, a small loss for a high-frequency circuit can be achieved.

Furthermore, according to the present invention, an inexpensive circuit board can be obtained, which allows high-density mounting and is excellent in noise resistance and a thermal dissipation property. The circuit board of the present invention can be used for a CPU driving circuit and a switching power supply of a computer.

Furthermore, according to the method for producing a capacitor-mounted metal foil of the present invention, the capacitor-mounted metal foil of the present invention can be produced easily.

Furthermore, according to the method for producing a circuit board of the present invention, the circuit board of the present invention can be produced easily.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A circuit board, comprising:

an insulating base;

a plurality of wiring patterns formed on at least two principal planes of the base;

inner vias formed in the base so as to connect the plurality of wiring patterns to each other; and a plurality of capacitors formed on a surface of at least one wiring pattern selected from the plurality of wiring patters, wherein each of the capacitors includes a conductive layer disposed above the at least one wiring pattern and a dielectric layer disposed between the at least one wiring pattern and the conductive layer.

2. A circuit board according to claim 1, wherein the plurality of wiring patterns include a wiring pattern formed in the base.

3. A circuit board according to claim 1, wherein the capacitor further includes a metal layer disposed between the at least one wiring pattern and the dielectric layer, and a surface of the metal layer that is in contact with the dielectric layer is roughened.

4. A circuit board according to claim 3, wherein the dielectric layer is made of an oxide of the metal forming the metal layer.

5. A circuit board according to claim 4, wherein the metal layer is made of a material selected from the group consisting of aluminum, tantalum, and niobium.

6. A circuit board according to claim 3, wherein the at least one wiring pattern and the metal layer are bonded to each other via a metallic bond.

7. A circuit board according to claim 1, wherein the at least one wiring pattern is made of a material selected from the group consisting of copper and nickel.

8. A circuit board according to claim 1, wherein the conductive layer comprises a conductive polymer layer and an electrode made of metal that are layered successively from the at least one wiring pattern side.

9. A circuit board according to claim 8, wherein the electrode is made of at least one metal selected from the group consisting of silver, copper, nickel, and aluminum.

10. A circuit board according to claim 1, wherein the conductive layer comprises a conductive polymer layer and a carbon layer that are layered successively from the at least one wiring pattern side.

11. A circuit board according to claim 2, wherein the dielectric layer is made of a nonconductive polymer.

12. A circuit board according to claim 1, further comprising a resistor disposed between wires of the at least one wiring pattern.

13. A circuit board according to claim 1, wherein the plurality of capacitors are arranged in a grid array shape on the at least one wiring pattern.

14. A circuit board according to claim 1, wherein all of the plurality of capacitors are connected to the inner vias.

15. A circuit board according to claim 1, wherein the base comprises a thermosetting resin and an inorganic filler.

16. A circuit board according to claim 1, wherein the base comprises a thermosetting resin and reinforce.

* * * * *

UNITED STATES PATENT AND TRADEMARK OFFICE
CERTIFICATE OF CORRECTION

PATENT NO.    : 6,525,921 B1
DATED         : February 25, 2003
INVENTOR(S)   : Nakatani et al.

It is certified that error appears in the above-identified patent and that said Letters Patent is hereby corrected as shown below:

<u>Column 17,</u>
Line 40, "patters," should read -- patterns, --

Signed and Sealed this

Ninth Day of December, 2003

JAMES E. ROGAN
*Director of the United States Patent and Trademark Office*